United States Patent
Pearson et al.

(10) Patent No.: US 12,125,664 B2
(45) Date of Patent: Oct. 22, 2024

(54) CHARGED PARTICLE BEAM SOURCE, SURFACE PROCESSING APPARATUS AND SURFACE PROCESSING METHOD

(71) Applicant: Oxford Instruments Nanotechnology Tools Limited, Abingdon (GB)

(72) Inventors: David Pearson, Abingdon (GB); Sebastien Pochon, Abingdon (GB); Joao Ferreira, Abingdon (GB)

(73) Assignee: Oxford Instruments Nanotechnology Tools Limited, Abingdon (GB)

( * ) Notice: Subject to any disclaimer, the term of this patent is extended or adjusted under 35 U.S.C. 154(b) by 0 days.

(21) Appl. No.: 17/575,429

(22) Filed: Jan. 13, 2022

(65) Prior Publication Data

US 2022/0216027 A1 Jul. 7, 2022

Related U.S. Application Data

(62) Division of application No. 16/691,908, filed on Nov. 22, 2019, now abandoned.

(30) Foreign Application Priority Data

Nov. 30, 2018 (GB) ..................... 1819600

(51) Int. Cl.
*H01J 37/08* (2006.01)
*H01J 27/02* (2006.01)
*H01J 37/32* (2006.01)

(52) U.S. Cl.
CPC ............ *H01J 37/08* (2013.01); *H01J 27/024* (2013.01); *H01J 37/32422* (2013.01); *H01J 2237/083* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 4,439,684 A | 3/1984 | Hemmerich et al. | |
| 5,300,774 A * | 4/1994 | Buttrill, Jr. ............. | H01J 49/40 250/288 |

(Continued)

FOREIGN PATENT DOCUMENTS

| | | |
|---|---|---|
| JP | H08129982 | 5/1996 |
| JP | 2014005799 | 1/2014 |
| WO | 0124217 | 4/2001 |

OTHER PUBLICATIONS

Extended Search Report from related European Application No. 19211580, dated Apr. 24, 2020, 8 pages.

*Primary Examiner* — Andrew Smyth
(74) *Attorney, Agent, or Firm* — Brooks, Cameron & Huebsch, PLLC

(57) ABSTRACT

A charged particle beam source for a surface processing apparatus is disclosed. The charged particle beam source comprises: a plasma chamber; a plasma generation unit adapted to convert an input gas within the plasma chamber into a plasma containing charged particles; and a grid assembly adjacent an opening of the plasma chamber. The grid assembly comprises one or more grids each having a plurality of apertures therethrough, the one or more grids being electrically biased in use so as to accelerate charged particles from the plasma through the grid(s) to thereby output a charged particle beam, the major axis of which is substantially perpendicular to the plane of the grid assembly. The transmissivity of the or each grid to the charged particles is defined by the relative proportion of aperture area to non-aperture area, and at least one of the grids has a transmissivity which varies across the grid along a first direction, the transmissivity being lower adjacent a first extremity of the grid than adjacent a second extremity of the grid opposite the first extremity, the first direction lying parallel to the plane of the grid assembly, such that in use the (Continued)

charged particle beam output by the source has a non-uniform charged particle current density profile in a plane parallel to the plane of the grid assembly which varies along the first direction, the charged particle current density being lower adjacent a first edge of the beam than adjacent a second edge of the beam opposite the first edge.

12 Claims, 6 Drawing Sheets

(56) References Cited

U.S. PATENT DOCUMENTS

| | | | |
|---|---|---|---|
| 5,924,277 A * | 7/1999 | Beattie | F03H 1/0043 |
| | | | 60/202 |
| 8,703,001 B1 | 4/2014 | Hegde | |
| 8,835,869 B2 | 9/2014 | Yevtukhov et al. | |
| 9,139,914 B2 | 9/2015 | Kim et al. | |
| 9,166,154 B2 * | 10/2015 | Satoh | H10N 50/01 |
| 10,319,578 B2 | 6/2019 | Muro et al. | |
| 10,751,549 B2 | 8/2020 | Hogstrom et al. | |
| 2002/0055264 A1 * | 5/2002 | Ito | G03F 7/405 |
| 2004/0124371 A1 | 7/2004 | Lee et al. | |
| 2004/0222082 A1 | 11/2004 | Gopalraja et al. | |
| 2006/0253510 A1 | 11/2006 | Kameyama | |
| 2007/0181820 A1 | 8/2007 | Hwang et al. | |
| 2012/0080307 A1 | 4/2012 | Kameyama | |
| 2013/0037725 A1 | 2/2013 | Kameyama | |
| 2013/0206583 A1 | 8/2013 | Druz et al. | |
| 2015/0318185 A1 * | 11/2015 | Kodaira | H01L 22/20 |
| | | | 156/345.28 |
| 2016/0181130 A1 | 2/2016 | Singh et al. | |
| 2016/0359020 A1 * | 12/2016 | Choi | H01L 21/3065 |
| 2017/0098458 A1 | 4/2017 | Kamiya et al. | |
| 2017/0140953 A1 | 5/2017 | Hegde | |
| 2017/0207077 A1 | 7/2017 | Nagorny et al. | |
| 2018/0005852 A1 | 1/2018 | Dhindsa et al. | |
| 2019/0074189 A1 * | 3/2019 | Park | H01L 21/0273 |
| 2019/0148109 A1 * | 5/2019 | Yun | H01L 21/67069 |
| | | | 156/345.55 |
| 2019/0148504 A1 * | 5/2019 | Chu | H10B 41/43 |
| | | | 257/316 |

* cited by examiner

CHARGED PARTICLE BEAM SOURCE, SURFACE PROCESSING APPARATUS AND SURFACE PROCESSING METHOD

FIELD OF THE INVENTION

The invention relates to a charged particle beam source, for generating an ion beam for example, as may be used in surface treatment processes such as ion beam etching (IBE), surface smoothing or other types of surface modification using the chemical and/or physical attributes of a charged particle beam. The invention also relates to surface processing apparatus incorporating such a charged particle beam source, and methods of surface processing using such a charged particle beam source, as well as methods of manufacturing a grid assembly for a charged particle beam source. The invention is particularly well adapted for use in skewed or angled ion beam etching and, even more particularly but not exclusively, to the production by ion beam etching of periodic slanted structures (e.g. gratings) such as those used in the field of optoelectronics, in particular in the field of augmented reality devices and components or in the field of solid state lasers.

BACKGROUND TO THE INVENTION

Charged particle beams, such as ion beams, are used in a variety of surface treatment methods with the outcome of modifying the surface of a substrate which is exposed to the beam. An example of such a method is ion beam etching, in which an ion beam is formed by extracting charged ions from a plasma and accelerating them towards the substrate using one or more appropriately biased grids (forming a grid assembly). Where the ion beam strikes the substrate surface, substrate material is removed (or "etched") at a rate dependent on the ion current density of the ion beam and the ion energy (which is determined by the grid voltage and is substantially uniform across the beam cross section). Typically, the etch will progress into the substrate in a direction substantially parallel to the major axis of the ion beam. A pattern can be etched into a substrate if a patterned masking layer protects part of the surface from the beam. For instance, if the substrate is normal to the major beam axis, the walls of the so-patterned etched feature(s) will also be substantially normal to the plane of the substrate. To improve uniformity of such features across the substrate, the ion beam is preferably generated in such a way so as to achieve a constant ion current density across the beam cross-section normal to the major beam axis, and some exemplary methods for achieving such uniformity are disclosed in U.S. Pat. No. 8,835,869 and US-A-2017/0140953.

In some processes, the substrate may not be substantially normal to the major axis of the ion beam and this may be inadvertent or intentional, e.g. to optimise an etch profile and/or to reduce sidewall re-deposition. To prevent this leading to non-uniformity of the etch features across the substrate due to beam divergence, in such scenarios the substrate is typically rotated about an axis normal to the substrate surface (on-axis rotation) during processing so that any non-uniformity is "averaged out".

However, certain types of asymmetric slanted etch profiles (e.g. those with an acute angle relative to the substrate normal) can only be formed on a substrate via ion beam etching if the substrate is held static at a certain non-orthogonal tilt angle relative to the major ion beam axis, with no rotation. In this way, the walls of the etched features will be at a corresponding non-orthogonal angle to the plane of the substrate. In variants of such processes, the tilt angle may be slightly varied during etching in order to, for example, modify the shape of the slanted features, or to prevent or remove sidewall re-deposition, but still there is no substrate rotation. In order to maintain quality and throughput, the etching process needs to be uniform across a large wafer area (for example, 100 to 200 mm diameter). However, due to the necessary tilted orientation of the substrate (resulting in one extremity of the substrate being closer to the ion beam source than the other), the ion current density of the ion beam incident on the substrate will vary across the substrate area, even if the ion current density emerging from the ion source is uniform across the beam cross-section. This is a result of the ion beam having a non-zero divergence (which will in general be a function of various parameters such as the beam voltage and current) which means that the ion current density decreases with increasing distance from the ion source. The variation in ion current density incident on the different regions of the tilted substrate leads to a corresponding variation in etch rate across the substrate and therefore non-uniform etched features.

One method aimed at reducing such non-uniformity in angled ion beam etching is disclosed in US-A-2017/0098458 and involves providing a shutter assembly between the ion source and the tilted substrate. The shutters of the assembly are moved during processing to define an opening between them through which the ion beam can pass, the position of which is moved during the etching procedure so that different regions of the substrate are exposed to the ion beam at different times. This is used to at least partially compensate for the variation in etch rate, but the primary purpose of this method, as disclosed, is to also compensate for angular variations in the etching process due to the tilt and ion beam divergence.

Improved methods for reducing non-uniformity of surface processing in such scenarios are sought. It will be appreciated that whilst the matter has been exemplified by reference to ion beam etching, similar non-uniformities arise in other forms of surface treatment utilising a charged particle beam and a tilted substrate, and so the invention is not limited to ion beam etching methods and apparatus.

In accordance with a first aspect of the invention, a charged particle beam source for a surface processing apparatus is provided, the charged particle beam source comprising:
   a plasma chamber;
   a plasma generation unit adapted to convert an input gas within the plasma chamber into a plasma containing charged particles;
   a grid assembly adjacent an opening of the plasma chamber, the grid assembly comprising one or more grids each having a plurality of apertures therethrough, the one or more grids being electrically biased in use so as to accelerate charged particles from the plasma through the grid(s) to thereby output a charged particle beam, the major axis of which is substantially perpendicular to the plane of the grid assembly;
   wherein the transmissivity of the or each grid to the charged particles is defined by the relative proportion of aperture area to non-aperture area, and at least one of the grids has a transmissivity which varies across the grid along a first direction, the transmissivity being lower adjacent a first extremity of the grid than adjacent a second extremity of the grid opposite the first extremity, the first direction lying parallel to the plane of the grid assembly, such that in use the charged particle beam output by the source has a non-uniform charged particle current density profile in a plane parallel to the plane of the grid assembly which varies along the first direction the charged particle current density being lower adjacent a first edge of the beam than adjacent a second edge of the beam opposite the first edge.

The charged particle beam source could be, for example, a positive ion beam source (if the potentials on the grid assembly are configured to extract positively charged ions from the plasma) or negative ion beam source (if the potentials on the grid assembly are configured to extract negative ions from the plasma). By providing at least one of the grids with a transmissivity which varies from one side of the grid to the other in the manner described (through varying the arrangement of apertures in the grid), fewer charged particles will be able to pass through the grid adjacent its first extremity than can pass through the grid adjacent its second, opposite, extremity, leading to an intentional non-uniformity in the charged particle density across the beam cross-section in the same first direction. The variation in transmissivity of the grid is such that the charged particle current density profile of the beam (in a plane parallel to the plane of the grid assembly) also varies and has a lower value adjacent its first edge (emitted through the first extremity of the grid) than at its second edge opposite the first (where the particles are emitted through the second extremity of the grid.

When used in conjunction with a static substrate tilted in the same first direction (as described in more detail below), the afore-mentioned non-uniformity of the surface treatment is reduced since portions of the substrate closer to the charged particle beam source are subjected to parts of the beam with a lower charged particle density (relative to the charged particle density in other lateral parts of the beam at the same distance from the beam source) and vice-versa. As a result, any variation in the charged particle current density incident on the different parts of the tilted substrate is reduced or eliminated as compared with conventional arrangements in which the beam has a substantially uniform charged particle current density across its cross-section. In the case of ion beam etching, this corresponds to reduced or eliminated variation in the etch rate across the tilted substrate and hence improved uniformity of etched features.

It will be appreciated that the precise nature of the variation in transmissivity of the at least one grid in the first direction will depend on various factors including the intrinsic uniformity (or lack thereof) of the charged particle beam, which will be influenced by the plasma chamber and plasma generating unit, and what is important is that, in combination with the plasma chamber and plasma generating unit, it results in a charged particle beam with a varying charged particle current density profile across its cross-section as specified. More preferably, the variation in transmissivity of the at least one grid in the first direction is configured such that the charged particle beam output by the source has a non-uniform charged particle current density profile in a plane parallel to the plane of the grid assembly which increases monotonically along the first direction, from the first edge of the beam to the second edge of the beam, at least at a range of distances from the grid assembly. This will achieve a more accurate compensation for the tilt of the substrate, and hence a better reduction in non-uniformity. As noted above, the current density profile of the beam will be influenced by multiple factors and hence the variation in transmissivity of the at least one grid may not necessarily also be a monotonic increase in order to achieve this in the beam. However, in preferred embodiments (e.g. where the beam extracted from the plasma chamber is intrinsically substantially uniform or near uniform), the transmissivity of the at least one of the grids increases monotonically across the grid along the first direction. It should also be appreciated that the charged particle current density profile across the beam cross-section may change with distance from the grid assembly. Hence the preferred monotonic increase may not be observed on every cross-section. What is desirable is that the region of the beam which will be incident on the substrate in use possesses the preferred monotonic increase.

In some preferred embodiments, the transmissivity varies across the grid along the first direction from a minimum transmissivity value adjacent the first extremity of the grid to a maximum transmissivity value adjacent the second extremity of the grid. However, it is not always the case that the minimum or maximum values of transmissivity will be located at an extremity of the grid. In other cases (particularly where the grid exhibits an additional variation in transmissivity, such as to compensate for radial non-uniformity as discussed below), the minimum or maximum value may be located at an interior position of the grid.

As noted above, the variation in the charged particle current density profile of the beam (preferably its monotonic increase) may be continuous or step-wise (e.g. laterally-spaced jumps in current density spaced by plateaux). Similarly, in preferred embodiments, the transmissivity of the at least one of the grids may vary continuously or in discrete steps along the first direction. As will be appreciated, a continuous variation may result in more accurate compensation and hence a better reduction in non-uniformity. However, a step-wise variation may be simpler, and more cost effective, to design and manufacture, and may in any event typically lead to a continuous variation in charged particle current density at a distance from the outer grid surface due to the aforementioned finite divergence of the charged particle beam.

The above-described variation in transmissivity along the first direction may be the only transmissivity variation exhibited by the at least one grid, the transmissivity being constant in a second direction perpendicular to the first. However, the transmissivity of the at least one grid may advantageously be additionally modulated to further tune the charged particle current density profile of the beam as desired. For example, it is common for beams generated by such apparatus to possess a radial non-uniformity with a higher current density at the centre of the beam relative to the beam periphery. To address this, if is preferable for the transmissivity of the at least one of the grids to have an additional radial variation so as to compensate for a radial non-uniformity of the plasma and/or beam. For example, the transmissivity of the at least one grid may increase from its centre towards its periphery along at least some (preferably all) of its radii.

As already mentioned, the transmissivity of the or each grid to the charged particles is defined by the relative proportion of aperture area to non-aperture area; that is, the proportion of the grid's area which is occupied by an aperture relative to the area which is not. Typically the or each grid will be formed by a plate of metal (such as molybdenum) or other electrically conductive material (such as pyrolytic graphite) with the apertures formed therethrough, although it could also be formed of a wire mesh or the like, the gaps between the wires forming the apertures. In the non-aperture areas, charged particles from the plasma will strike the grid material and be blocked from passing through the grid. The variation in transmissivity is achieved by locally varying the proportion of aperture to non-aperture area from location to location across the grid. This can be implemented, for example, by locally varying one or more of the size, shape, number or spacing of the apertures through the grid. In essence, the pattern of apertures (including any or all of the above factors) is arranged to vary across the grid.

As noted above, the grid assembly may preferably comprise a plurality of grids and in this case it is desirable that at least the apertures in the grid closest to the plasma chamber have corresponding apertures in the other grid(s) with which they are aligned along the direction perpendicular to the plane of the grid assembly. This ensures that charged particles passing through the initial grid are not obstructed by the other grids of the assembly, although in practice a small offset or misalignment can be acceptable (and indeed can be intentionally introduced for 'steering' the individual beamlets or modifying the overall broad beam profile). It is only necessary for one of the grids, preferably the grid closest to the plasma chamber (often referred to as the "screen grid"), to exhibit the above-defined transmissivity variation in the first direction. It should be noted here that all the apertures in the grid closest to the plasma most preferably have a corresponding aligned aperture in all the other grids, whereas the other grids may have additional apertures which do not correspond to apertures in the grid closest to the plasma.

This scenario is particularly advantageous to minimize costs when first designing and testing a particular configuration, to allow several iterations of the first grid pattern to optimize etch uniformity for a particular substrate tilt angle without having to re-manufacture more than one grid. For example, in a grid assembly comprising two grids, a first grid (preferably that closest to the plasma) could be provided with the described variation in transmissivity in the first direction and the second grid could instead be provided with a uniform transmissivity or an axisymmetric transmissivity variation only, as may be used to produce a radially uniform beam, (with for example some of these apertures being removed from the first grid or the sizes of some of the apertures being varied so as to produce the described variation in transmissivity in the first direction). In such a case the combination of the two grids would then exhibit the described increase in current density along the first direction. However, it is preferable that all holes of the respective grids are substantially aligned with one another along a direction perpendicular to the plane of the grid assembly.

Also, for operational and maintenance reasons, it is preferable that the transmissivity of each of the grids of the grid assembly varies across the respective grid along the first direction, the transmissivity being lower adjacent a first extremity of the grid than adjacent a second extremity of the grid opposite the first extremity. Most preferably, all of the grids have corresponding and aligned apertures. Furthermore, if any additional transmissivity variations are to be applied (such as radial), it is preferable that these too are applied to each of the grids of the grid assembly. Most preferably, the transmissivity of each of the grids of the grid assembly varies across the respective grid in substantially the same manner. For example, the respective grids may have identical and aligned aperture patterns across their full areas.

Whilst the grid assembly may comprise a single grid, more preferably between two and five grids will be incorporated. In preferred examples, the grid assembly comprises at least two grids which are oppositely biased in use (relative to ground) to accelerate charged particles therebetween, and preferably further comprises a third grid which is grounded. If additional grids are provided, these are preferably located between the second and third grid such that the ground grid remains that furthest from the plasma. The additional grids are typically biased in the same sense as the second grid. If the grid assembly comprises only a single grid, it may include other components to assist in forming the charged particles which pass through the grid into a collimated beam.

The grid(s) of the grid assembly could have any lateral shape, which will define the peripheral shape of the beam. However, most preferably, the or each grid is substantially circular such that the charged particle beam has a substantially circular cross-section, especially when etching substantially circular substrates. The grid(s) may be flat or could be domed, in which latter case the plane in which the periphery of the grid sits is considered to be the plane of the grid (and of the grid assembly). The peripheral shape and size of the grid is measured by projection of the domed grid surface onto that plane.

The invention finds particular utility where large-area substrates are to be processed, e.g. having a diameter of up to 20 cm, since it is in such scenarios that the effects of non-uniformity (reduced or eliminated by the present invention) are most significant. Advantageously, each grid is at least as wide as the substrate to be processed and preferably up to 50% wider. As such, the or each grid has a width (diameter, in the case of circular grids) of at least 10 cm, preferably at least 20 cm, more preferably around 30 cm. This enables the beam generated to be of sufficient cross-sectional area to process large-area substrates. Again, where the grid is domed, the width measurement is taken parallel to the plane in which the periphery of the grid sits.

Any type of plasma generating unit can be used to convert the input gas into a plasma. For example, in preferred embodiments, the plasma generation unit may comprise any of: hot-filament DC plasma sources (for example a Kaufmann source), capacitively coupled RF plasma sources, microwave plasma sources, or inductively-coupled plasma sources. Factors to take into account when selecting which type of plasma source to use include the cost, ease of forming a plasma, chemical compatibility and the optimum working pressure range of the plasma inside the source.

In accordance with a second aspect of the invention, a surface processing apparatus is provided, comprising:
  a processing chamber;
  a substrate holder inside the processing chamber; and
  a charged particle beam source in accordance with the first aspect of the invention arranged to output the charged particle beam towards the substrate holder in use;
  wherein the substrate holder is configured to hold a substrate, in use, such that the plane of the substrate is non-orthogonal to the major axis of the charged particle beam, the substrate being tilted relative to the charged particle beam source in the first direction such that a first extremity of the substrate is located closer to the charged particle beam source than a second extremity of the substrate, opposite the first, the first extremity of the substrate being located on the same side of the charged particle beam as the first extremity of the at least one grid and the second extremity of the substrate being located on the same side of the charged particle beam as the second extremity of the at least one grid.

Thus, the substrate holder is configured to hold a substrate, in use, at a non-orthogonal angle relative to the major axis of the beam in the manner already referred to above in connection with the first aspect of the invention. The result is a reduction or elimination in non-uniformity of the current density incident on the tilted substrate across its area as already described above.

Any variation in the transmissivity of the at least one grid in the first direction leading to a variation in the charged particle current density profile of the beam in a plane parallel to the grid assembly of the sort already described will help compensate for the tilted orientation of the substrate to an extent and is therefore beneficial. However, to achieve more accurate compensation it is preferable that in use the charged particle beam output by the source has a non-uniform charged particle current density profile in a plane parallel to the plane of the grid assembly which increases monotonically along the first direction, from the first edge of the beam to the a second edge of the beam, at least at a range of distances from the grid assembly, which range includes the location of the substrate. Further, it is particularly preferred that the transmissivity of the at least one grid in the first direction varies in a manner dependent on the magnitude of the angle of tilt of the substrate in the first direction such that, in use, the charged particle current density of the charged particle beam incident on the substrate is substantially uniform across the substrate. In other words, the specific angle at which the substrate will be held by the substrate holder is preferably taken into account in the design of the at least one grid so that its variation in transmissivity is tailored to compensate as accurately as possible for the particular tilt angle in use.

For example, if the tilt angle of the substrate holder and the degree of beam divergence is known (which can be measured either by carrying out a normal incidence etch with substrate rotation, using a substrate diameter larger than that of the grid assembly, or by calculations tracing particle paths through the grids, as is known in the art), a corresponding transmissivity variation which will approximately compensate for the non-uniform current density experienced by the substrate at that tilt angle can be determined. It will be appreciated that the apparatus may not achieve a precisely uniform current density at all points across the substrate—for example, if the transmissivity variation is step-wise there may be a small step-wise variation in current density of the beam incident on the tilted substrate—but at least the current density incident on the substrate adjacent the two extremities of the beam should be substantially equal.

As noted above, the invention is particularly adapted for use in treating non-rotating, static tilted substrates and hence preferably the substrate holder is configured to hold the substrate in a fixed, rotationally static position in use. In particular it is desirable that the substrate holder is configured so as not to rotate the substrate during processing, although it optionally may be operable to change the tilt angle during processing as mentioned further below.

Preferably, the substrate holder is configured to hold a substrate of at least 10 cm width (diameter, in the case of circular substrates), preferably at least 15 cm width, more preferably around 20 cm width. This is desirable in order to enable the apparatus to be used to process large-area substrates.

The specific tilt angle of the substrate selected will depend on the desired geometry of the features to be formed by the surface treatment (e.g. etched). In preferred examples, the substrate holder is configured to hold the substrate at a (fixed) tilt angle in the range 20 to 80 degrees (inclusive), preferably 25 to 60 degrees (inclusive), between the major axis of the charged particle beam and the plane of the substrate, in the first direction.

A third aspect of the present invention provides a method of surface processing, comprising:

providing a plasma processing apparatus in accordance with the second aspect of the invention;

mounting a substrate on the substrate holder in the processing chamber of the plasma processing apparatus, such that the plane of the substrate is non-orthogonal to the major axis of the charged particle beam, the substrate being tilted relative to the charged particle beam source in the first direction such that a first extremity of the substrate is located closer to the charged particle beam source than a second extremity of the substrate, opposite the first, the first extremity of the substrate being located on the same side of the charged particle beam as the first extremity of the at least one grid and the second extremity of the substrate being located on the same side of the charged particle beam as the second extremity of the at least one grid; and activating the charged particle beam source to thereby treat the surface of the substrate using the charged particle beam.

The method provides an improved uniformity of the surface treatment on the tilted substrate for all the reasons explained in connection with the first and second aspects of the invention, above.

Advantageously, the charged particle beam output by the source has a non-uniform charged particle current density profile in a plane parallel to the plane of the grid assembly which increases monotonically along the first direction, from the first edge of the beam to the a second edge of the beam, at least at a range of distances from the grid assembly, which range includes the location of the substrate. The charged particle current density profile can be measured in any plane by various means, such as by performing an etch of a substrate normal to the major beam axis in that plane, or by inserting beam current probes into the beam at appropriate locations.

In particularly preferred implementations, the transmissivity of the at least one grid in the first direction is configured to vary in a manner dependent on the magnitude of the angle of tilt of the substrate in the first direction such that the charged particle current density of the charged particle beam incident on the substrate is substantially uniform across the substrate. Methods by which this can be achieved were mentioned above in connection with the second aspect of the invention.

As indicated above, it is strongly preferable that the substrate is fixed in a static rotational position for the duration of the treatment using the charged particle beam. That is, there is no rotation of the substrate about its normal or about the major axis of the charged particle beam. As noted above, it is however possible to make minor changes to the tilt angle ($\alpha$) during processing in order to control the shape of the features. If the tilt angle ($\alpha$) is varied during processing then the transmissivity variation of the grid may be designed based either on the average tilt angle expected to be utilized during processing, or the highest tilt angle ($\alpha$) expected to be utilized during processing, or the tilt angle ($\alpha$) at which the substrate will be held for the longest duration. Which option will produce the best results can be determined based on the type of processing to be performed, by the skilled person.

The nature of the charged particle beam will depend on the type of surface treatment to be performed. In some preferred implementations, the grid assembly is biased to extract positive ions from the plasma and the charged particle beam is a positive ion beam. In other preferred implementations, the grid assembly is biased to extract negative ions from the plasma and the charged particle beam is a negative ion beam. Likewise, in preferred examples the treating of the substrate may be any of: ion beam etching, ion beam smoothing, chemical or physical surface modification, ion heat treatment, or surface analysis. More generally, the disclosed technique is applicable to any surface modification processes which use the chemical and/or physical attributes of a charged particle beam.

As noted at the outset, the disclosed apparatus and methods are particularly well suited to slanted or asymmetrically angled features and so, preferably, the treating of the substrate comprises etching of angled features into the substrate, the walls of which make a non-zero angle with the substrate normal. For example, the features to be etched may comprise slanted gratings, or angled facets for diode lasers. Still preferably, the angled features may have a re-entrant negative angle (examples of which are described below with reference to FIGS. 12A and B). For example, the angled features may include an acute angle relative to the normal of the substrate surface. It is also preferable that the angled features are periodic across the substrate.

A fourth aspect of the present invention provides a method of manufacturing a grid assembly for a charged particle beam source, comprising:
(a) selecting a tilt angle at which a substrate is to be positioned relative to the major axis of the charged particle beam output by the charged particle beam source in a first direction;
(b) for the selected tilt angle, determining the non-uniformity in charged particle current density of the charged particle beam output by the charged particle beam source using an arbitrary grid assembly along the first direction at the intersection with the substrate;
(c) based on the determined non-uniformity and the arbitrary grid assembly, designing a grid template in which the transmissivity of the grid varies in the first direction so as to compensate for the determined non-uniformity in charged particle current density; and
(d) making a grid assembly in which at least one of the grids is in accordance with the designed grid template.

The resulting grid assembly is suitable for use as the grid assembly of a charged particle beam source in accordance with the first aspect of the invention. It will be appreciated that while the compensation aimed for in step (c) may preferably be complete compensation (such as to eliminate non-uniformity of the ultimate surface treatment on a tilted substrate), this is not essential and the compensation may achieve a lesser reduction in the non-uniformity.

In step (c), the grid template can be designed starting from the known layout of the apertures of the arbitrary grid assembly (i.e. the size, shape, number and spacing of the apertures) and adjusting this to introduce the variation in the transmissivity. For instance, in a preferred implementation, step (c) comprises using the determined non-uniformity to define a correction factor to be applied to the arbitrary grid assembly and applying the correction factor to the layout of the arbitrary grid assembly.

Examples of charged particle beam sources, surface processing apparatus and associated methods will now be described and contrasted with conventional examples by reference to the following drawings, in which:

FIG. 1 schematically illustrates an example of a surface processing apparatus which can be used in embodiments of the present invention;

Figure 8:
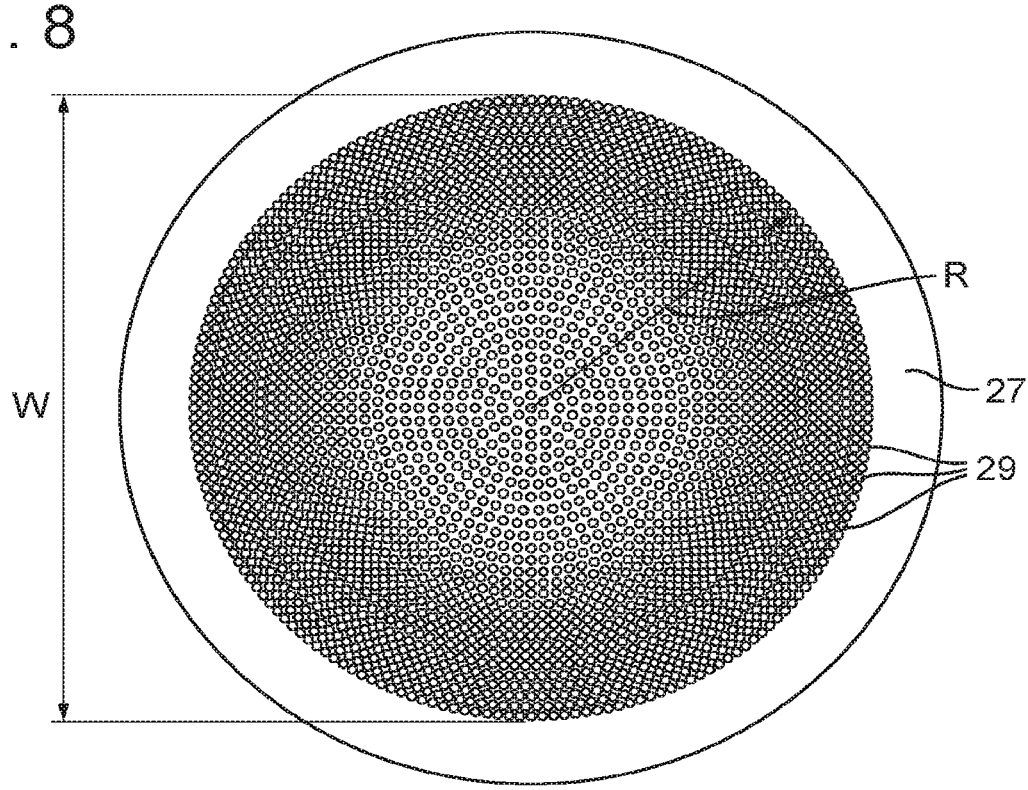
FIG. 8 shows in plan view another example of a grid of a conventional apparatus.
Figure 9:
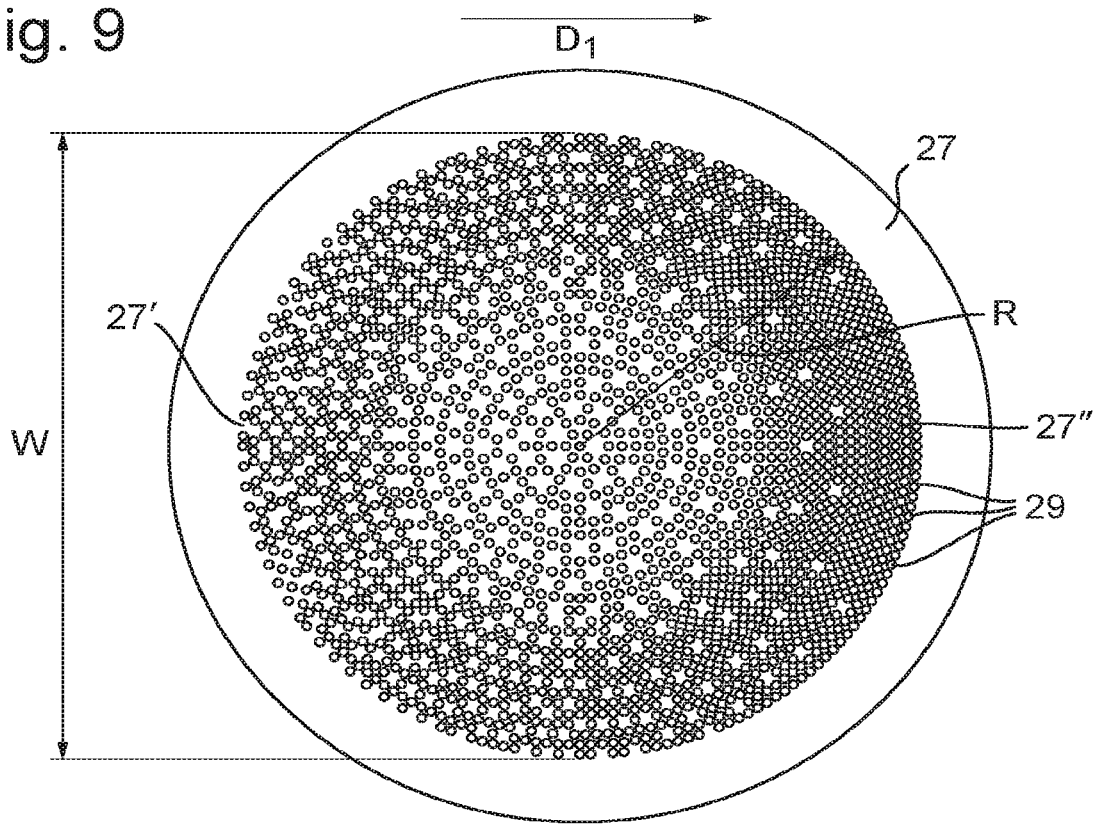
FIG. 9 shows in plan view another embodiment of a grid which may be used in embodiments of the present invention.
Figure 11:
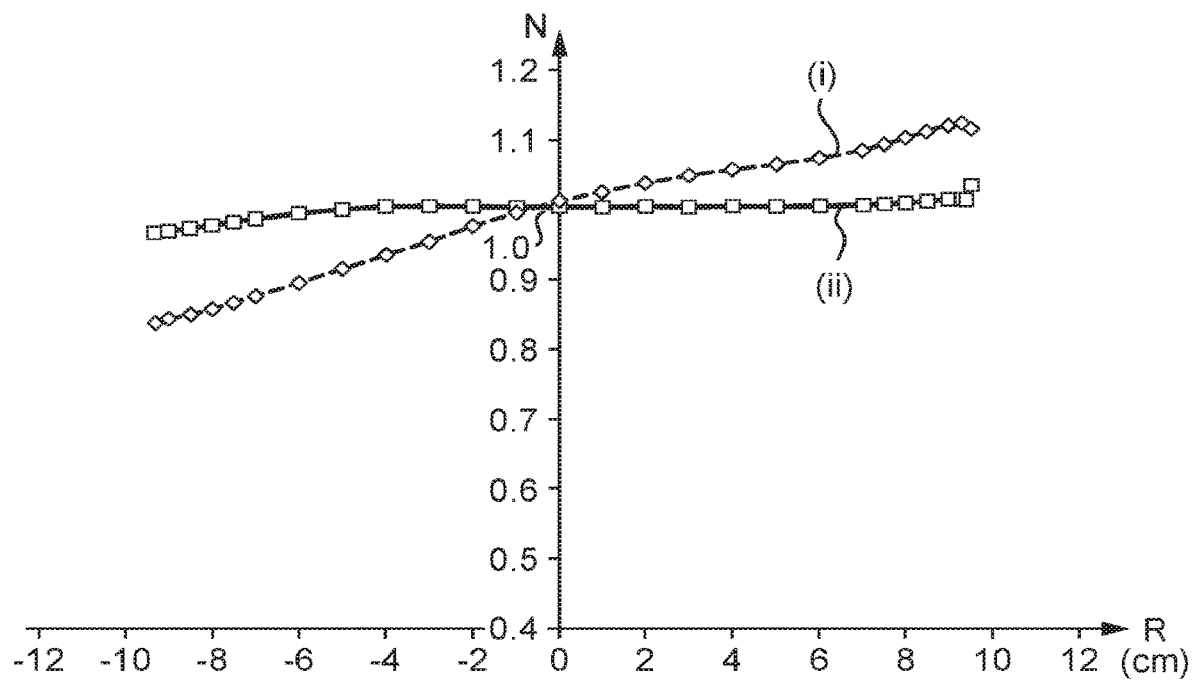
Figure 12A:
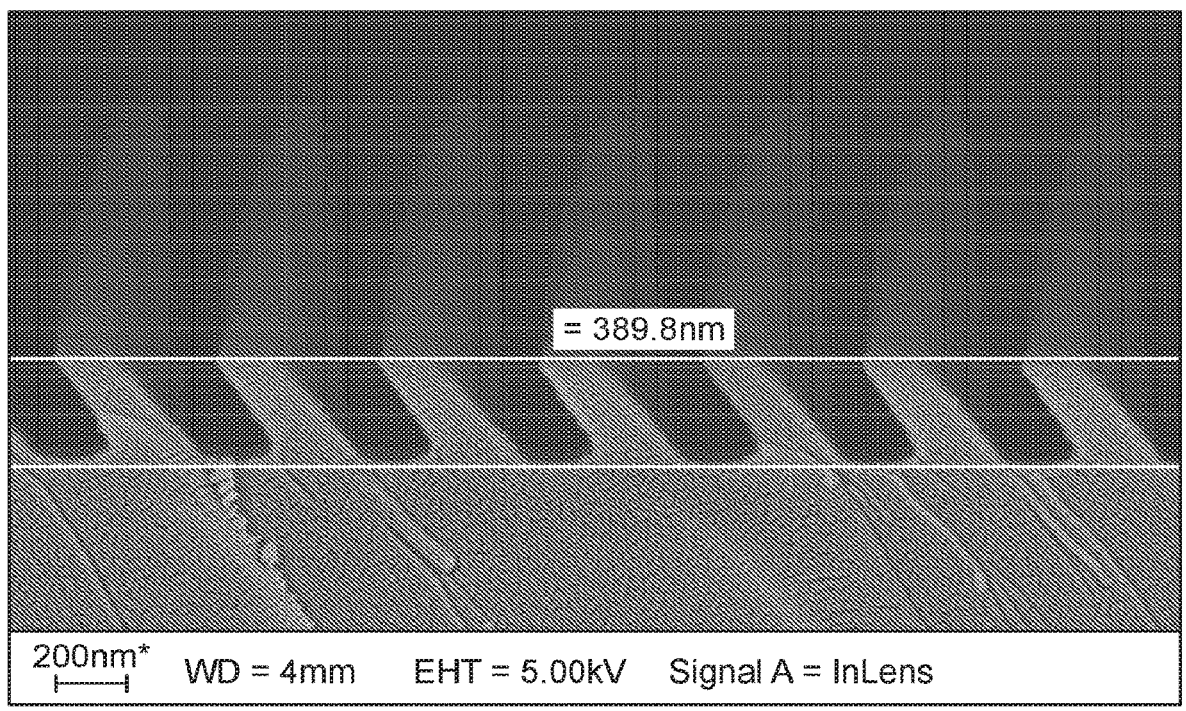
Figure 12B:
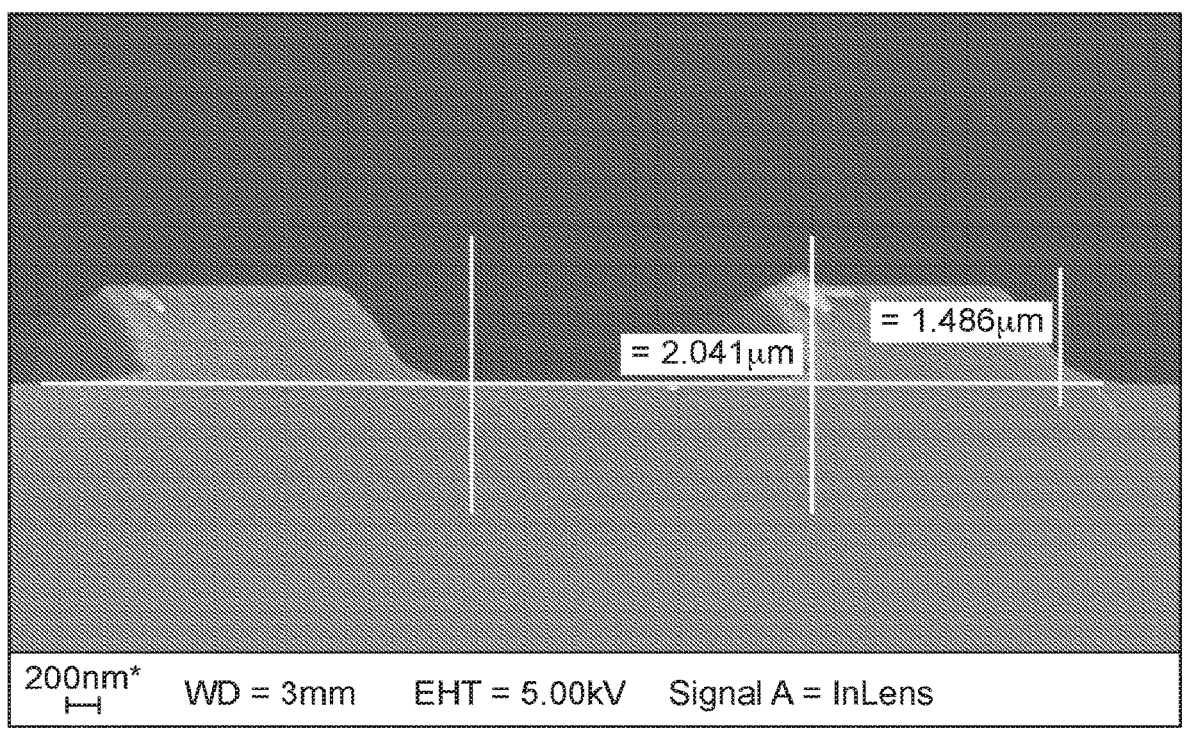

FIG. 11 is a plot showing normalised etch rate (N) against radial position (R) experienced by a substrate at a 45 degree tilt angle from the major axis of a charged particle beam, (i) in an exemplary conventional apparatus utilising a grid of the sort shown in FIG. 8, and (ii) in an apparatus according to an embodiment of the present invention utilising a grid of the sort shown in FIG. 9; and FIGS. 12A and 12B are images taken by a scanning electron microscope of exemplary etched features formed by methods in accordance with the present invention.

The ensuing description will focus on examples of charged particle beam sources in the form of positive ion beam sources and corresponding surface processing apparatus and methods utilising positive ion beams, such as ion beam etching. However, as noted above, the presently disclosed principles are equally applicable to the formation of negative ion beams and surface processing apparatus and methods utilising negative ion beams.

Figure 1:
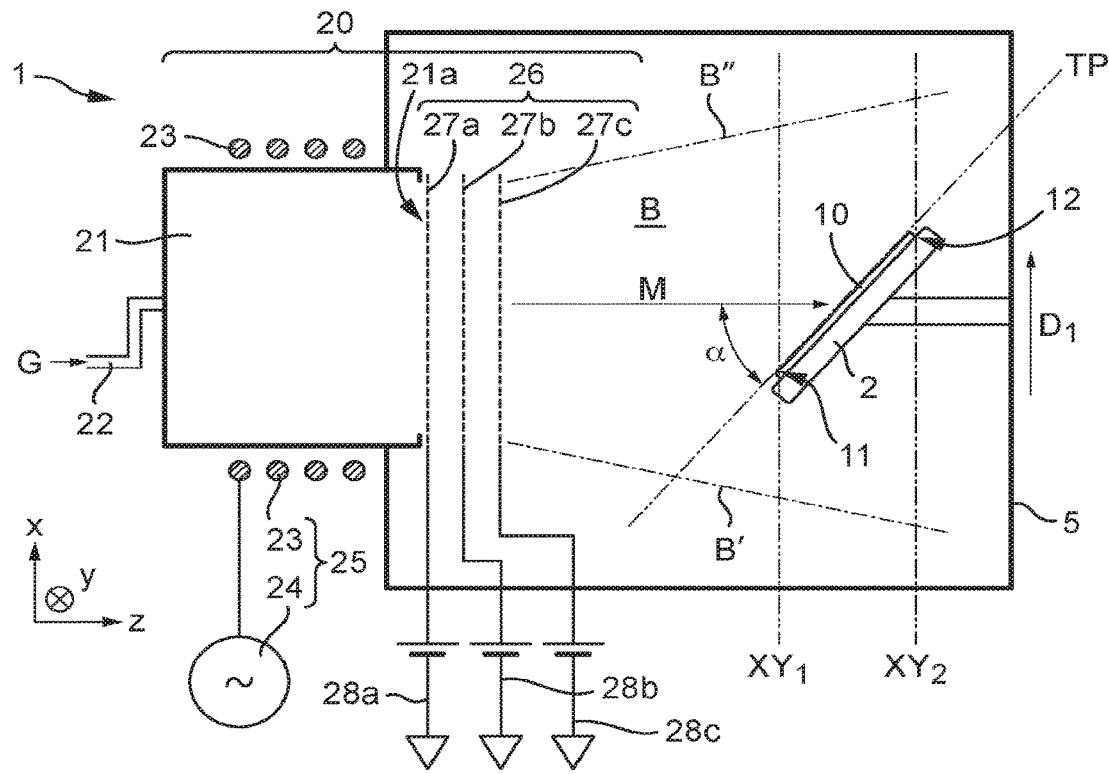

FIG. 1 schematically depicts a surface processing apparatus 1 having a charged particle beam source 20, herein the form of an ion beam source. The Figure will be used to describe the functioning of both a conventional surface processing apparatus and a surface processing apparatus in accordance with embodiments of the present invention, with the differences being highlighted below. The apparatus 1 comprises an ion source 20 arranged to output an ion beam B towards a substrate 10 located in a processing chamber 5. It will be appreciated that the apparatus may comprise additional features such as gas inlets and outlets into the processing chamber 5, pumping systems and/or heating systems, for example, none of which are shown here for clarity. Apparatus of the sort depicted can be used to perform many types of surface treatment of a substrate 10, such as ion beam etching, ion beam smoothing, chemical or physical surface modification, ion heat treatment and surface analysis.

The ion beam source 20 comprises a plasma chamber 21 into which an input gas G is supplied in use by a suitable conduit 22. For example, in an ion beam etching process the input gas G may be argon. A plasma generation unit 25 is provided which, when activated, energises the gas within plasma chamber 21 and converts it into a plasma of charged particles comprising charged ions and electrons. Any type of plasma generator could be utilised for this purpose but in the present example, the plasma generation unit 25 is an inductively coupled plasma source comprising a conductive coil 23 encircling the plasma chamber 21 which is connected to a signal generator for supplying a radio frequency oscillating signal via a matching unit (not shown). The oscillating signal in the coil 23 induces an electric field within the plasma chamber 21 which converts the input gas G into a plasma. In alternative embodiments, rather than use an inductive plasma source as shown, a capacitively coupled plasma source, a microwave plasma source or a plasma generator using a source based on a DC discharge may be utilised instead.

The plasma chamber 21 has an opening 21a facing generally towards the substrate 10, adjacent to which is provided a grid assembly 26, which serves to extract charged particles from the plasma at a defined energy and current. The grid assembly 26 may comprise a single grid 27 or a plurality of grids 27a, 27b, 27c etc. Generally it is preferred that the grid assembly 26 comprises at least two grids such as grids 27a and 27b. In the example depicted, the grid assembly 26 comprises three grids 27a, 27b and 27c. Each grid comprises for example a plate or mesh of conductive material, preferably metal or graphite, with a plurality of apertures provided therethrough. The grids may be flat (planar) or could possess a curvature (i.e. have the form of a shallow dish or dome), in which latter case the "plane" of the grid is that in which its periphery lies, and that of the grid assembly as a whole will be parallel. The radius of any such curvature can be used to help control the global convergence or divergence of the beam. Where multiple grids are provided, they are arranged to overlap one another in substantially parallel planes with a spacing between each one. Preferably, the apertures in each of the grids 27a, 27b, 27c are substantially aligned with one another in order to facilitate passage of charged particles from the plasma to the processing chamber 5.

One or more of the grids 27 forming the grid assembly 26 will be electrically biased in use by connection to a suitable power supply to extract charged particles from the plasma in plasma chamber 21 and accelerate them towards the substrate 10, thereby forming the charged particle beam B. Typically, the grid assembly 26 will include at least two grids 27a, 27b which are oppositely biased (relative to ground). For example, to form a positive ion beam, first grid 27a (typically referred to as the screen grid) will be positively biased by connection to a positive DC voltage 28a, while second grid 27b (typically referred to as the accelerator) will be negatively biased by connection to a negative DC voltage 28b. If a third grid 27c is provided (typically referred to as the decelerator), this is preferably grounded by a suitable earth connection 28c as shown. This arrangement when activated causes positive ions to be extracted from the plasma in chamber 21 and accelerated through the gaps between adjacent grids 27a, 27b and 27c in that order to form the output ion beam B. It will be appreciated that other numbers of grids 27 can be incorporated into the grid assembly 26 as necessary, e.g. to modify the beam divergence. Where more than three grids 27 are provided, typically the first grid (closest to the plasma chamber; the "screen grid") will be biased in one sense, the second grid (the "accelerator") will be biased in the opposite sense (relative to ground) as will any subsequent grids, and the last grid (furthest from the plasma; the "decelerator") will be at ground potential.

The ion beam B will have a major beam axis M which generally defines the overall direction of the ions. The major beam axis M will be substantially perpendicular to the plane of the grid assembly 26. Hence, in this example, the grid assembly lies in an x-y plane and the major beam direction M is substantially parallel to the z-axis.

Opposite the ion source 20, a substrate holder 2 is provided on which the substrate 10, such as a silicon wafer, will be mounted in use. It will be appreciated that the substrate holder 10 is only depicted schematically and in practice will incorporate a clamping mechanism or similar for retaining the substrate 10 on the substrate holder in use. The substrate holder 2 is configurable to hold a substrate 10 at a tilted angle ($\alpha$) relative to the major axis of the ion beam, M. The substrate holder is configured to keep the substrate rotationally static during processing, but optionally may be operable to change the tilt angle during processing if desired. The tilt of the substrate is in a first direction $D_1$ which here is parallel to the x-axis. There is no tilt in the y-axis direction and hence all lines lying in the tilt plane TP are parallel to the y-axis. The tilt plane TP corresponds to the plane in which the surface of substrate 10 lies. A first extremity 11 of the substrate 10 is closer to the ion source 20 than is the opposite extremity 12 of the substrate 10. The cross-section of the ion beam B in a plane perpendicular to the major beam axis M (and thus parallel to the grid assembly 26) is depicted as $XY_1$ at the point at which the beam is incident on the first extremity 11 of substrate 10, and as $XY_2$ at the point of which the beam is incident on the opposite extremity 12 of the substrate 10.

In conventional implementations of an ion beam source 20 of the sort depicted in FIG. 1, the ion beam B is configured to have as uniform a current density across its cross-section as possible, at least in the region of the beam which strikes the substrate 10 (the shape of the current density profile may conceivably vary with distance from the ion source 20 along the beam axis M). Nonetheless, there will inevitably be a divergence of the beam B as the particles travel away from the grid assembly 26, as illustrated in FIG. 1 by the chain-dashed lines B' and B" which illustrate the opposite edges of the beam B in the first direction $D_1$. Thus the cross-sectional area of the ion beam B (which is preferably substantially circular) increases along the major beam direction M. This has the result that the ion current density of the beam decreases in the same direction.

Figure 2A:
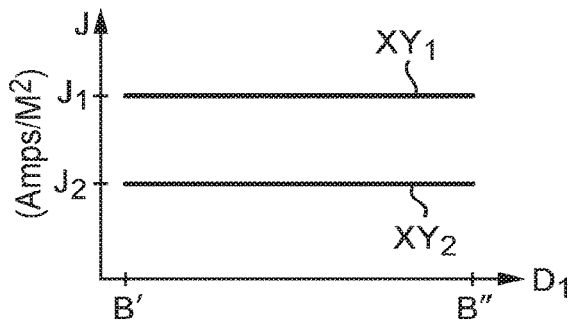
FIGS. 2A and 2B show plots of charged particle current density (J) across a charged particle beam, FIG. 2A along the first direction ($D_1$), and FIG. 2B along the tilt plane (TP) of a tilted substrate, in an exemplary conventional apparatus.
Figure 2B:
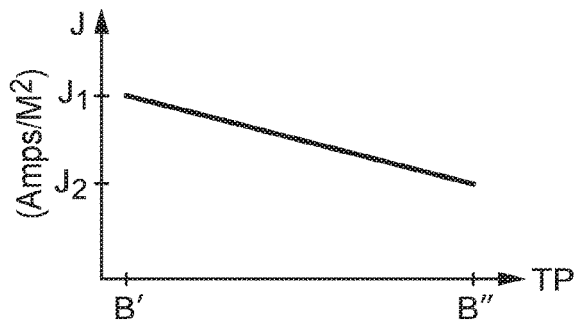

This is illustrated for an exemplary conventional ion beam source in FIGS. 2A and 2B, in which FIG. 2A schematically shows the current density J (in amps/m$^2$) of the beam B across the two exemplary cross-sectional planes $XY_1$ and $XY_2$ labelled in FIG. 1 in the first direction $D_1$. Thus, across the plane $XY_1$ (which is coincident with the first extremity 11 of the substrate 10), the ion beam B has a substantially constant ion current density along the first direction $D_1$, here labelled with an arbitrary value of $J_1$. Across plane $XY_2$ (which is coincident with the opposite extremity 12 of the substrate 10), across the ion beam B in the first direction $D_1$, the current density has a substantially uniform value of $J_2$, which is less than $J_1$. Thus, the two extremities 11 and 12 of the substrate 10 experience different ion current densities from one another ($J_1$ and $J_2$ respectively), meaning that across the substrate surface (which lies in the tilt plane TP), the incident current density J decreases from one extremity of the substrate 10 to the other, as shown in FIG. 2B. Since the etch rate is directly related to the incident current density, this causes a corresponding non-uniformity in the etch rate and hence the depth of the resulting etched features across the substrate in the first direction $D_1$. (The etch rate will also depend on the ion energy, but this substantially uniform both across the ion beam and along the major axis direction, and hence across the substrate. In examples, the ion energy may be in the range of 20 eV to several keV).

Figure 3A:
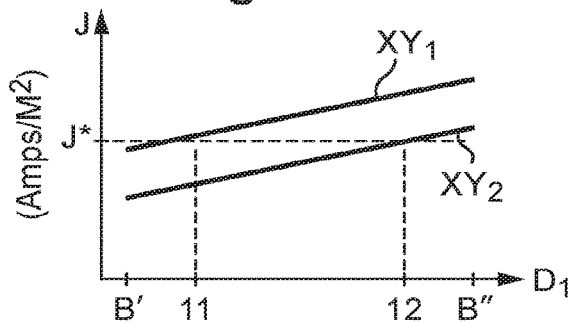
FIGS. 3A and 3B show plots of the charged particle current density (J) across a charged particle beam, FIG. 3A along the first direction ($D_1$), and FIG. 3B along the tilt plane direction (TP) of a tilted substrate, in an embodiment of the present invention.
Figure 3B:
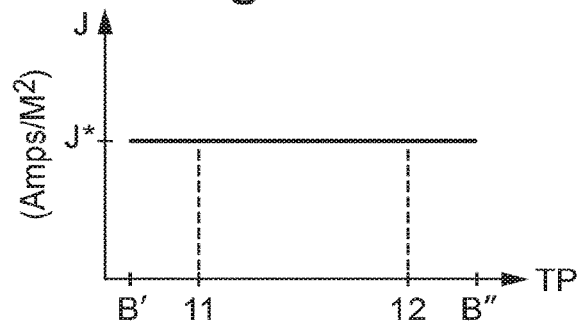

FIGS. 3A and 3B show plots corresponding to those of FIGS. 2A and 2B for a first embodiment of a surface processing apparatus in accordance with the present invention. In such an apparatus, the ion source 20 is configured so that the generated ion beam B has an ion current density profile across its cross-section which is not uniform but rather varies in the first direction $D_1$. This is shown in FIG. 3A which schematically depicts the ion current density profile of an exemplary ion beam B across the two cross-sections $XY_1$ and $XY_2$ shown in FIG. 1. As before, at any one position in the first direction $D_1$, the ion current density value J will be higher on the plane $XY_1$ than on the plane $XY_2$, since the plane $XY_1$ is closer to the ion beam source 20. However, both cross-sectional profiles now show an increase in ion current density J from a lower value at the first beam edge B' to a higher value at the opposite beam edge B" in the first direction $D_1$. The positions in the first direction $D_1$ of the two substrate extremities 11 and 12 are also marked on FIG. 3A and it will be seen that, at the position at which the first extremity 11 is coincident with plane $XY_1$, the ion current density has a value of J*, and similarly at the position at which the second extremity 12 of the substrate 10 is coincident with plane $XY_2$, the ion current density again has substantially the same value of J*. The result, as shown in FIG. 3B, is that the ion current density incident on the tilted substrate 10 is substantially constant, with a value of J*. That is, the substrate 10 experiences a substantially uniform flux of ions across its surface and hence a substantially uniform etch rate. This leads to improved uniformity of the etched features formed in its surface, relative to that achieved in conventional processing.

It should be noted that FIG. 3A illustrates the beam as having a current density which monotonically increases in the first direction $D_1$ from a minimum value at the first edge B' to a maximum value at the second edge B' in each of the cross-sectional planes $XY_1$ and $XY_2$. This is preferred in order to enable more accurate compensation for the tilt, but other forms of variation can still achieve compensation to some extent and are therefore useful. Further, as noted above, the shape of the current density profile of the beam may vary with distance from the ion source 20 and so it is not essential that a monotonically increasing profile is achieved at every position along the major beam axis M. What is important is that, in the vicinity of the substrate 10, the profile is preferably monotonically increasing.

Figure 4:
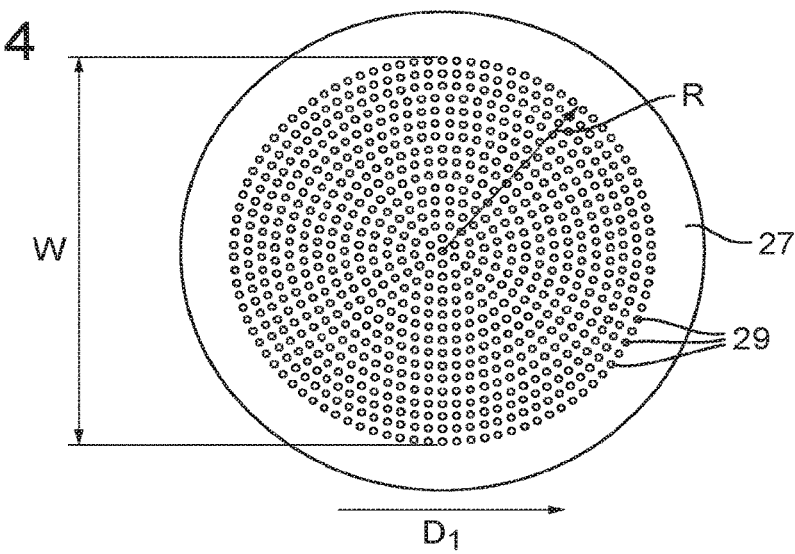
FIG. 4 shows in plan view an exemplary grid of a conventional apparatus.

In conventional ion beam surface processing systems, in which the ion beam is to have a uniform current density profile (as shown in FIG. 2A), the one or more grids 27 making up grid assembly 26 may be of the sort depicted in FIG. 4, which is a plan view of a conventional grid 27. The grid 27 comprises a (flat or domed) plate of conductive material such as metal, through which a plurality of apertures 29 are arranged. In this example, the portion of the plate containing the apertures is circular with a width or diameter (VV) which defines the circular shape and initial size of the beam B. The apertures 29 are arranged with constant size and spacing so that the proportion of aperture area to non-aperture area remains substantially constant across the whole grid 27. As such, the transmissivity of the grid to charged particles is also substantially constant along the grid. This is achieved in the example shown by arranging the apertures in a series of concentric circles of increasing radius R radiating from a central point of the grid plate 27.

Figure 5:
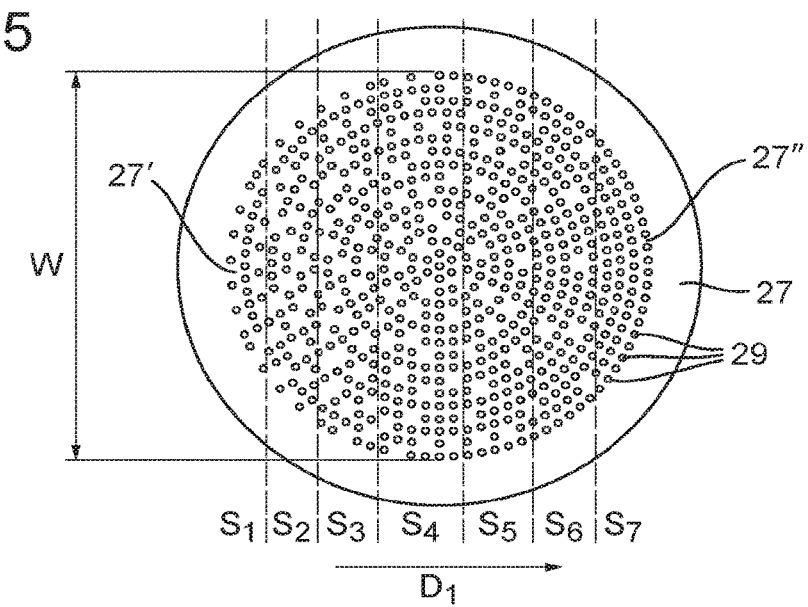
FIG. 5 shows in plan view an embodiment of a grid suitable for use in embodiments of the present invention.

FIG. 5, in contrast, shows an embodiment of a grid plate 27 which may be used in implementations of the present invention. The grid 27 is of substantially the same construction as that described with reference to FIG. 4, but the arrangement of apertures 29, whilst being based on that shown in FIG. 4, has been modified. In particular, it will be seen that the number of apertures provided increases in the first direction $D_1$ from a minimum number of apertures per unit area at a first extremity 27' of the grid 27 to a maximum number of apertures per unit area at the opposite extremity 27". Thus the proportion of aperture area to non-aperture area increases across the grid 27 in the first direction $D_1$. This results in a corresponding increase in the transmissivity of the grid 27 to the charged particles in the first direction $D_1$. The manner in which the transmissivity variation can be implemented will be described further below but, in all cases, the aim is to achieve a variation in the ion current density across the beam cross-section in the first direction, preferably a monotonic increase, as described in relation to FIG. 3A. By "monotonically increasing" it is meant that the beam current density always increases in the first direction $D_1$ and never decreases (although might plateau). In FIG. 3A this increase has been shown as continuous and linear, which is most preferred, but in practice this may not be the case. For example, the current density may increase in a non-linear (e.g. curved) or step-wise manner across the beam.

In the case of the grid 27 shown in FIG. 5, the increase in transmissivity has been implemented step-wise across the grid 27. Thus, the grid has been divided into seven segments $S_1$, $S_2$, $S_3$, $S_4$, $S_5$, $S_6$, $S_7$ one after the other in the first direction $D_1$, and the transmissivity value (i.e. the proportion of aperture area to non-aperture area) in each segment has been set to a desired value by removing selected apertures relative to the conventional template pattern shown in FIG. 4. This results in a step-wise increase in transmissivity across the grid 27 in the first direction $D_1$ and hence the variation in the beam current density in the same direction will also have a step-wise artefact. Preferably, at the point on the grid 27 corresponding to the extremity of the substrate 10 furthest from the ion source (extremity 12, corresponding to extremity 27" of the grid), the transmissivity of the grid is the maximum achievable; that is, the maximum proportion of aperture area to non-aperture area that the grid 27 can support in practice. This is the case in segment $S_7$ in the example grid shown. The proportions of aperture area to non-aperture area in the other segments across the grid are then varied by a factor dependent on the tilt angle ($\alpha$) of the substrate as described further below.

Figure 6:
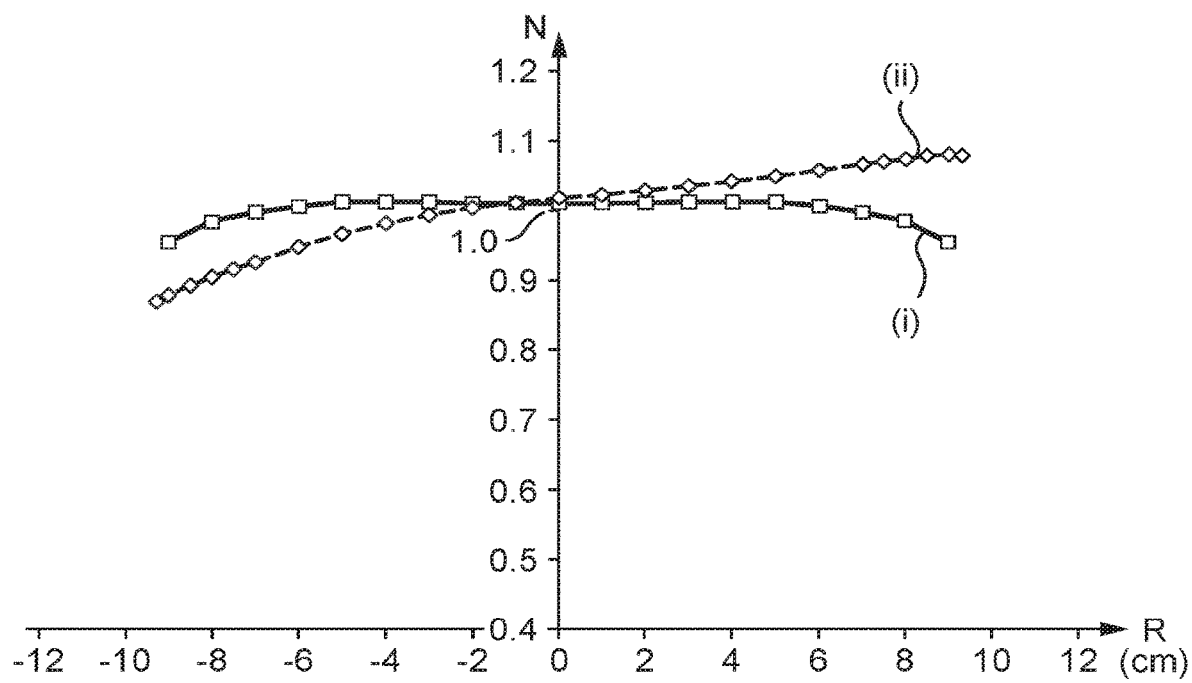
FIG. 6 is a plot showing normalised etch rate (N) against radial position (R) experienced by a substrate, (i) normal to the major axis of a charged particle beam, and (ii) tilted by 45 degrees relative to the major direction of the charged particle beam, in an exemplary conventional apparatus incorporating a grid of the sort shown in FIG. 4.
Figure 7:
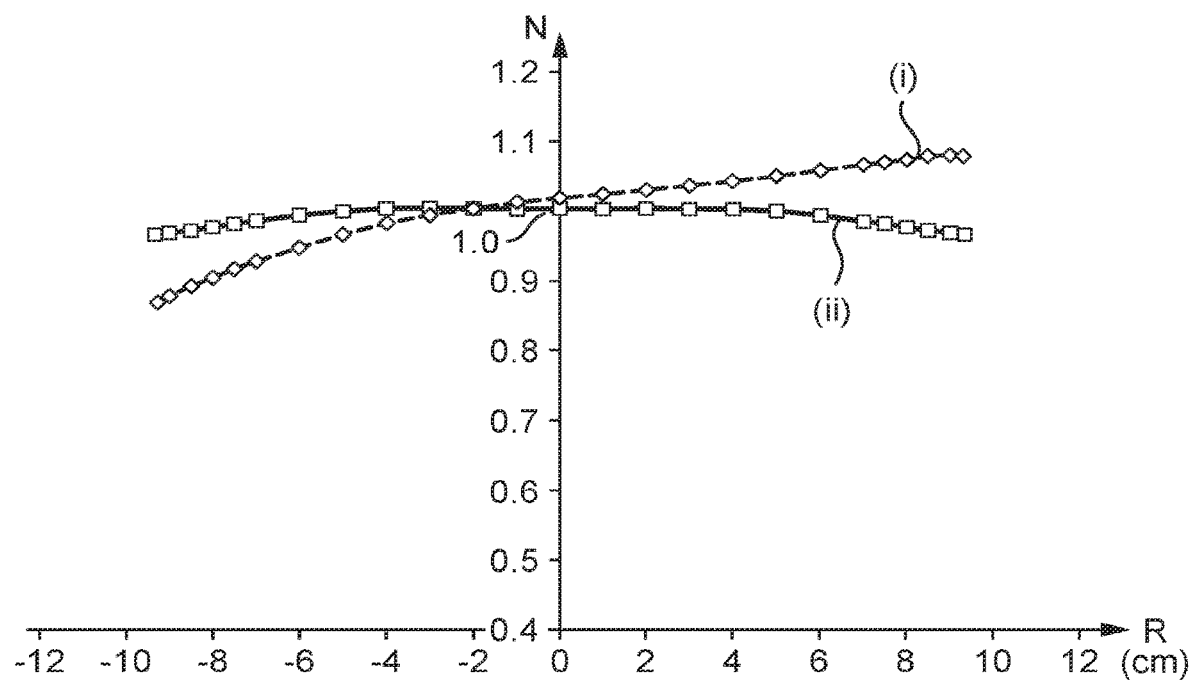
FIG. 7 is a plot showing normalised etch rate (N) against radial position (R) experienced by a substrate at a 45 degree tilt angle from the major axis of a charged particle beam, (i) in an exemplary conventional apparatus utilising a grid of the sort shown in FIG. 4, and (ii) in an apparatus according to an embodiment of the present invention utilising a grid of the sort shown in FIG. 5.

FIGS. 6 and 7 illustrate the effect of replacing a conventional grid as shown in FIG. 4 with a modified grid of the sort shown in FIG. 5 in an embodiment of the invention. Thus, FIG. 6 is a plot of normalised etch rate N across a substrate surface measured along the radius R in the first direction, for (i) a substrate positioned normal to the major beam axis M, and (ii) a substrate at a 45 degree tilt angle ($\alpha$) between the tilted substrate plane TP and the major beam axis M in a conventional surface processing apparatus with a grid of the sort shown in FIG. 4. The normalised etch rate N is calculated from the measured etch rate divided by the average etch rate across the substrate in each case (and is thus dimensionless). It will be seen from plot (i) that, for the substrate substantially normal to the major beam direction M in this conventional apparatus, the etch rate is substantially uniform across the substrate and substantially symmetrical about the substrate centre, although it does show a radial decrease. In contrast, from plot (ii) it can be seen that the tilted substrate experiences a marked difference in normalised etch rate N from the left hand extremity of the substrate to the right hand extremity.

In FIG. 7, plot (i) again depicts the normalised etch rate across a substrate at a 45 degree tilt angle ($\alpha$) between the tilted substrate plane TP and the major beam axis M in a conventional surface processing apparatus with a grid of the sort shown in FIG. 4, and hence is identical to plot (ii) of FIG. 6. Plot (ii) of FIG. 7 now shows the normalised etch rate across a substrate at a 45 degree tilt angle ($\alpha$) between the tilted substrate plane TP and the major beam axis M in an embodiment of a surface processing apparatus in accordance with the present invention, utilising a grid of the sort shown in FIG. 5. It will be seen that now the etch rate is substantially uniform across the substrate, showing only a symmetrical, radial decrease of a similar magnitude to that experienced by a non-tilted substrate in a conventional apparatus (see plot (i) of FIG. 6). Hence the non-uniformity introduced by the tilted arrangement of the substrate has been reduced (and in this case substantially eliminated) by the above-described variation in transmissivity of the grid 27 in the first direction.

As noted in connection with FIGS. 6 and 7, it is common for the ion beam B to possess a radial non-uniformity, having a higher ion current density towards the centre of the beam than at its periphery. This applies to both conventional ion sources and those proposed in the present application. This can be addressed by providing a grid 27 with a corresponding radial variation in transmissivity and an example of such a grid plate 27 is shown in plan view in FIG. 8. Here it will be seen that the proportion of aperture area to non-aperture area increases with increasing radial distance R from the centre of the grid.

Hence, in particularly preferred implementations of the present invention, the grid plate 27 includes such a radial variation in transmissivity in addition to the variation in transmissivity along the first direction $D_1$ provided for the reasons already described. An embodiment of such a grid plate 27 is shown in plan view in FIG. 9. Here it will be seen that, in addition to the transmissivity (i.e. the proportion of aperture to non-aperture area) increasing in the first direction $D_1$, there is also a radial variation with the transmissivity being depressed towards the centre of the grid 27 relative to its peripheries.

It will be noted in this case that the transmissivity of the grid 27 may not increase continuously in the first direction. For example, it may dip in the centre of the plate in order to provide the necessary radial correction. Indeed, the minimum transmissivity may be located at an interior position of the grid rather than at an extremity. However, there is still a general increase in transmissivity across the grid in the first direction $D_1$ from the first extremity 27' to the opposite extremity 27": that is, the transmissivity at extremity 27' is less than that at the opposite extremity 27". What is important is that the transmissivity variation results in a variation in the current density J of the beam in the same direction $D_1$ from a lower value at one edge of the beam B' to a higher value at the opposite edge B" (preferably a monotonic increase), which will be influenced by the geometry of the plasma source 21, 25 itself as well as the parameters of the grid 27.

Figure 10:
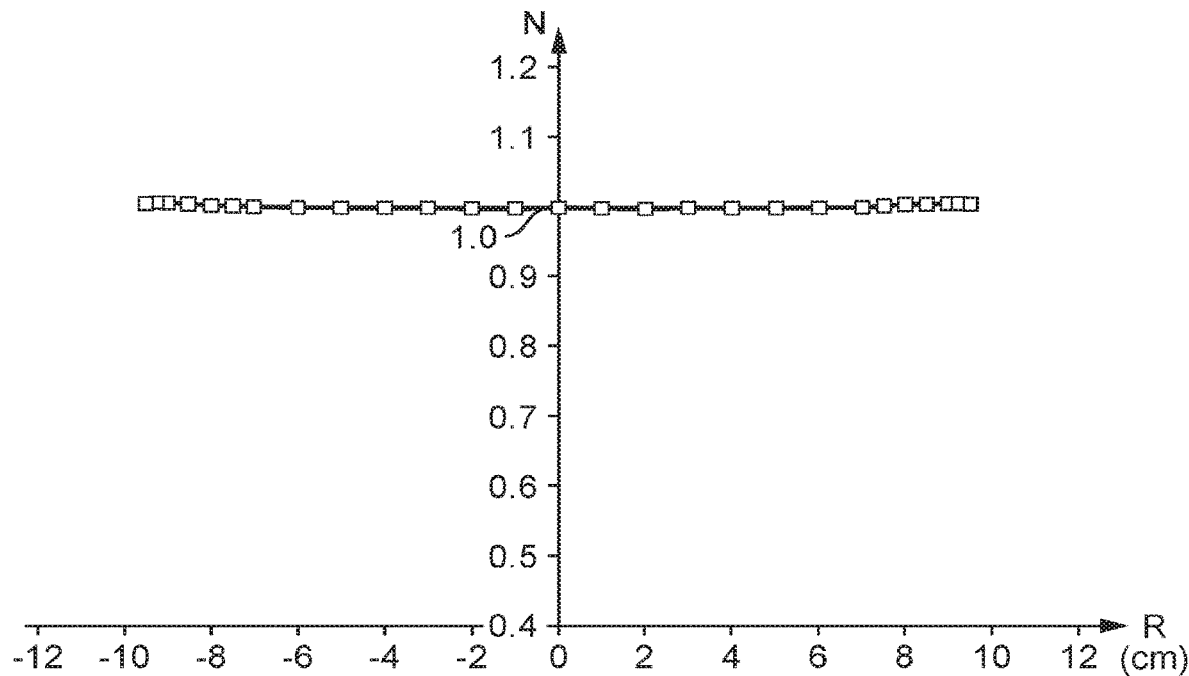
FIG. 10 is a plot showing normalised etch rate (N) against radial position (R) experienced by a substrate normal to the major beam direction, in an exemplary conventional apparatus with a grid of the sort shown in FIG. 8.

Etch results achieved using the exemplary grids shown in FIGS. 8 and 9 will now be contrasted by reference to FIGS. 10 and 11. FIG. 10 shows the normalised etch rate (N) across a substrate held normal to the major axis M of the beam B in a conventional apparatus utilising a grid 27 of the sort shown in FIG. 8. It will be seen that here the normalised etch rate is substantially constant across the whole substrate showing only a very small radial variation.

FIG. 11 shows the normalised etch rate (N) across a substrate held at a 45 degree tilt angle ($\alpha$) between its tilt plane (TP) and the major beam axis (M), (i) for a conventional apparatus utilising a grid 27 of the sort shown in FIG. 8, and (ii) for an apparatus in accordance with embodiments of the present invention using a modified grid 27 of the sort shown in FIG. 9. As shown by plot (i), using the conventional grid of FIG. 8, the tilted substrate 10 experiences a large variation in normalised etch rate N across from one extremity to the other in the direction $D_1$. In contrast, utilising a modified grid 27 of the sort shown in FIG. 9, plot (ii) shows that the normalised etch rate N is now substantially constant across the tilted substrate, resulting in uniformly etched features. It will be noted that now the variation in transmissivity of the grid 27 compensates both for the tilt of the substrate and for any radial ion current density non-uniformity caused by non-uniformity of plasma inside the ion source.

For all of the normalised etch rate plots shown in FIGS. 6, 7, 10 and 11, this data was obtained from etches performed in argon on $SiO_2$ coated wafers (substrates) of 200 mm wafer diameter. The grids shown in FIGS. 4, 5, 8 and 9 each have a width (or diameter) W of 30 cm. More generally, the apparatus is preferably configured to enable processing of large area substrates such as these and the grid diameter should be at least as large as the diameter of the substrate being etched, and preferably up to 50% larger.

It will be seen from the graphs of FIGS. 6, 7 and 11 that the original etch non-uniformity (before the improvement achieved by the presently disclosed technique) was at least +/−10%, as shown in FIG. 6 curve (ii), across the substrate. The improvement in etch uniformity across a 200 mm diameter substrate achieved by the presently disclosed technique is demonstrated in FIG. 7 and in FIG. 11, in which latter case the non-uniformity in etch depth is below +/−2% across a 200 mm diameter substrate.

It will be appreciated that whilst in the examples shown the variation in transmissivity has been achieved by locally varying the number of apertures per unit area of the grid, this could equally be achieved by locally varying any one or more of: the size of the apertures, the shape of the apertures or the spacing of the apertures, either instead of or in addition to varying the number of apertures.

Any increase in transmissivity of the grid in the first direction $D_1$ will compensate to some extent for a tilt of the substrate 10 in the same direction. As such, it is not essential that the transmissivity variation in the grid be tailored to the particular tilt angle ($\alpha$) of the substrate, but this is strongly preferred. Only in this way can the etch rate be made substantially uniform across the large area substrate. Hence, preferably, the ion current density profile of the ion beam B in the first direction $D_1$ is configured by the grid 27 to compensate for the fall off of the ion beam current due to the beam divergence experienced by the substrate 10 at the particular tilt angle at which it is positioned.

For any particular tilt angle ($\alpha$), this can be achieved by the following method. First, using an arbitrary conventional grid 27 (such as those described in relation to FIG. 4 or 8), the non-uniformity in ion current density J experienced by a substrate 10 at the tilt angle ($\alpha$) is determined. This can be achieved either by performing an etch under these conditions and measuring the variation in the extent of etching of the two extremities of the substrate or, if the divergence of the ion beam B is known, this can be calculated by standard trigonometry at least to a first iteration. The beam divergence can be obtained from a normal incidence etch with substrate rotation, using a substrate diameter larger than the area of the grids, or by calculations tracing ion paths through the grids, as is known in the art.

Once the non-uniformity has been determined, an appropriate correction factor which will compensate for the non-uniformity can be calculated and used to determine the desired transmissivity of the grid at each point across its first direction $D_1$. As mentioned above, preferably the maximum achievable aperture area to non-aperture area proportion is provided at the second extremity of the grid 27 corresponding to the furthest point 12 on the substrate 10, where the inherent etch rate would be lowest due to the tilt angle. The proportion of aperture area to non-aperture area is then varied inversely across the grid in the negative first direction ($-D_1$), according to the ratio of the local etch rate measured from the conventional grid to this minimum etch rate at the furthest extremity. (As a first approximation, the corresponding locations on the substrate 10 and on the grid 27 can be determined by reference to the radius of the position in question relative to the outer radius of the substrate and of the grid respectively). Once the desired transmissivity of each location of the grid has been determined, this can be implemented through design of the aperture pattern, e.g. by changing the local size of the apertures, or their shape or spacing or (as in the depicted examples) by removing selected apertures. Typically this will be based on the template of the arbitrary conventional grid that has been used for the initial measurements. New grids can then be manufactured based on the modified aperture pattern design.

As mentioned above, in some cases it can be advantageous to make small changes to the tilt angle ($\alpha$) during processing, which can provide additional control over the shape of the resulting features, or be used to remove and/or prevent sidewall re-depositions during the etch process. In such cases the transmissivity variation for the grid can be calculated based for instance on the average value of $\alpha$ expected during the processing, or the highest tilt angle, or on the tilt angle at which the substrate will be held for the greatest duration.

In particularly preferred embodiments, all of the grids 27 making up grid assembly 26 will be provided with the same pattern of apertures 29, and hence with the same variation in transmissivity in the first direction. However, this is not essential: at a minimum, only one of the grids 27 in the grid assembly 26 need be configured as disclosed herein (preferably the grid closest to the plasma, i.e. the "screen grid" 27a). Nonetheless, it is still preferable that, at least for the grid 27a closest to the plasma chamber 21, each of its apertures 29 will have corresponding and aligned apertures in each of the other, downstream, grids 27b, 27c etc so as not to block the passage of charged particles which travel through the first grid 27a. Most preferably, all of the apertures in each of the grids 27 are aligned with one another along a direction perpendicular to the plane of the grid assembly for this reason. However, it is also possible for the respective apertures in each grid to be misaligned by a small offset between them, which under certain circumstances can be used for 'steering' the individual beamlets.

If only one of the grids 27 is provided with the transmissivity variation along the first direction disclosed here in, it is strongly preferable that this should be the grid closest to the plasma chamber (i.e. the "screen grid" 27a). This is because, the grid carrying the transmissivity variation will typically have fewer apertures than grids without the said transmissivity variation (at least in regions of the grid assembly). As such, if the grid with the transmissivity variation is closest to the plasma chamber, the beamlets it lets pass are unlikely to be obstructed by the downstream grids. However, if the arrangement were different and one of the downstream grids 27b, 27c were to carry the transmissivity variation instead, whilst the apparatus would operate as described initially, it is likely to experience problems in the long term caused by the grid with the disclosed transmissivity variation being struck in non-aperture areas by beamlets from the screen grid. In time, by material erosion, this could lead to the formation of new apertures in the grid and disabling of the desired transmissivity variation altogether.

FIGS. 12A and 12B show two examples of features etched by ion beam etching using processes in accordance with the present invention. Thus, FIG. 12A shows a slanted grating array etched in quartz using a $CHF_3+Ar$ chemistry with a Cr mask. The slant angle of the features relative to the substrate normal was 30 degrees and hence the tilt angle of the substrate (angle $\alpha$ in FIG. 1) in this case was 60 degrees. FIG. 12B shows a slanted facet etch for laser diodes etched in GaAs using a $Cl_2+Ar$ chemistry with a photoresist mask. Both types of feature have a re-entrant or acute angle—one etch wall cuts under the masked region, while the opposite etch wall slopes away from the masked region (into the depth of the feature). In each case, the features were produced by holding the substrates rotationally static at the required tilt angle using an ion beam with a monotonically increasing current density in the same direction as the tilt of the substrate in the manner described above.

The invention claimed is:
1. A method of surface processing, comprising:
providing a surface processing apparatus comprising:
a processing chamber;
a substrate holder inside the processing chamber; and
a charged particle beam source arranged to output the charged particle beam towards the substrate holder in use, the charged particle beam source comprising:
a plasma chamber;
a plasma generation unit adapted to convert an input gas within the plasma chamber into a plasma containing charged particles;
a grid assembly adjacent an opening of the plasma chamber, the grid assembly comprising one or more grids each having a plurality of apertures therethrough, the one or more grids being electrically biased in use so as to accelerate charged particles from the plasma through the grid(s) to thereby output a charged particle beam, the major axis of which is substantially perpendicular to the plane of the grid assembly;
wherein the transmissivity of each grid to the charged particles is defined by the relative proportion of aperture area to non-aperture area, and at least one of the grids has a transmissivity which varies across the grid along a first direction, the transmissivity being lower adjacent a first extremity of the grid than adjacent a second extremity of the grid opposite the first extremity, the first direction lying parallel to the plane of the grid assembly, such that in use the charged particle beam output by the source has a non-uniform charged particle current density profile in a plane parallel to the plane of the grid assembly which varies along the first direction, the charged particle current density being lower adjacent a first edge of the beam than adjacent a second edge of the beam opposite the first edge;

wherein the substrate holder is configured to hold a substrate, in use, such that the plane of the substrate is non-orthogonal to the major axis of the charged particle beam, the substrate being tilted relative to the charged particle beam source in the first direction such that a first extremity of the substrate is located closer to the charged particle beam source than a second extremity of the substrate, opposite the first, the first extremity of the substrate being located on the same side of the charged particle beam as the first extremity of the at least one grid and the second extremity of the substrate being located on the same side of the charged particle beam as the second extremity of the at least one grid;

the method further comprising:

mounting a substrate on the substrate holder in the processing chamber of the surface processing apparatus, such that the plane of the substrate is non-orthogonal to the major axis of the charged particle beam, the substrate being tilted relative to the charged particle beam source in the first direction the angle between the major axis of the charged particle beam and the plane of the substrate, in the first direction is in the range of 20 to 80 degrees, whereby a first extremity of the substrate is located closer to the charged particle beam source than a second extremity of the substrate, opposite the first, the first extremity of the substrate being located on the same side of the charged particle beam as the first extremity of the at least one grid and the second extremity of the substrate being located on the same side of the charged particle beam as the second extremity of the at least one grid; and activating the charged particle beam source to thereby treat the surface of the substrate using the charged particle beam, wherein a masked region of the surface of the substrate is protected from the beam by a patterned masking layer, and wherein the treating of the substrate comprises etching of angled features into the substrate, the sidewalls of which make a non-zero angle with the substrate normal, such that each angled feature has a re-entrant negative angle whereby a first sidewall of the angled feature cuts into the masked region and a second sidewall of the angled feature opposite the first sidewall slopes away from the masked region.

2. A method according to claim 1, wherein the charged particle beam output by the source has a non-uniform charged particle current density profile in a plane parallel to the plane of the grid assembly which increases monotonically along the first direction, from the first edge of the beam to the a second edge of the beam, at least at a range of distances from the grid assembly, which range includes the location of the substrate.

3. A method according to claim 1, wherein the transmissivity of the at least one grid in the first direction is configured to vary in a manner dependent on the magnitude of the angle of tilt of the substrate in the first direction such that the charged particle current density of the charged particle beam incident on the substrate is substantially uniform across the substrate.

4. A method according to claim 1, wherein the substrate is fixed in a static rotational position for the duration of the treatment using the charged particle beam.

5. A method according to claim 1, wherein the grid assembly is biased to extract positive or negative ions from the plasma and the charged particle beam is an ion beam.

6. A method according to claim 1, wherein the treating of the substrate is ion beam etching, ion beam smoothing, chemical or physical surface modification, ion heat treatment, or surface analysis.

7. A method according to claim 1, wherein the angled features are preferably periodic across the substrate.

8. A surface processing apparatus, comprising:
a processing chamber;
a substrate holder inside the processing chamber; and
a charged particle beam source arranged to output the charged particle beam towards the substrate holder in use, the charged particle beam source comprising:
a plasma chamber;
a plasma generation unit adapted to convert an input gas within the plasma chamber into a plasma containing charged particles;
a grid assembly adjacent an opening of the plasma chamber, the grid assembly comprising one or more grids each having a plurality of apertures therethrough, the one or more grids being electrically biased in use so as to accelerate charged particles from the plasma through the grid(s) to thereby output a charged particle beam, the major axis of which is substantially perpendicular to the plane of the grid assembly;

wherein the transmissivity of each grid to the charged particles is defined by the relative proportion of aperture area to non-aperture area, and at least one of the grids has a transmissivity which varies across the grid along a first direction, the transmissivity being lower adjacent a first extremity of the grid than adjacent a second extremity of the grid opposite the first extremity, the first direction lying parallel to the plane of the grid assembly, such that in use the charged particle beam output by the source has a non-uniform charged particle current density profile in a plane parallel to the plane of the grid assembly which varies along the first direction, the charged particle current density being lower adjacent a first edge of the beam than adjacent a second edge of the beam opposite the first edge;

wherein the substrate holder is configured to hold a substrate, in use, such that the plane of the substrate is non-orthogonal to the major axis of the charged particle beam, the substrate being tilted relative to the charged particle beam source in the first direction the angle between the major axis of the charged particle beam and the plane of the substrate, in the first direction is in the range of 20 to 80 degrees, whereby a first extremity of the substrate is located closer to the charged particle beam source than a second extremity of the substrate, opposite the first, the first extremity of the substrate being located on the same side of the charged particle beam as the first extremity of the at least one grid and the second extremity of the substrate being located on the same side of the charged particle beam as the second extremity of the at least one grid;

the surface processing apparatus being configured to activate the charged particle beam source, in use, to thereby treat the surface of the substrate using the charged particle beam, wherein the treating of the substrate comprises etching of angled features into the substrate, the sidewalls of which make a non-zero angle with the substrate normal, such that each angled feature has a re-entrant negative angle whereby a first sidewall of the angled feature cuts into a masked region protected by a patterned masking layer which covers the surface of the substrate in the masked region, and a second sidewall of the angled feature opposite the first sidewall slopes away from the masked region.

9. A surface processing apparatus according to claim 8, wherein the transmissivity of the at least one grid in the first direction varies in a manner dependent on the magnitude of the angle of tilt of the substrate in the first direction such that, in use, the charged particle current density of the charged particle beam incident on the substrate is substantially uniform across the substrate.

10. A surface processing apparatus according to claim 8, wherein in use the charged particle beam output by the source has a non-uniform charged particle current density profile in a plane parallel to the plane of the grid assembly which increases monotonically along the first direction, from the first edge of the beam to the a second edge of the beam, at least at a range of distances from the grid assembly, which range includes the location of the substrate.

11. A surface processing apparatus according to claim 8, wherein the substrate holder is configured to hold the substrate in a fixed, rotationally static position in use.

12. A surface processing apparatus according to claim 8, wherein the substrate holder is configured to hold a substrate of at least 10 cm width.

\* \* \* \* \*